United States Patent [19]

Burns

[11] 4,009,473
[45] Feb. 22, 1977

[54] CHARGE COUPLED MEMORY SYSTEM

[75] Inventor: Joseph R. Burns, Trenton, N.J.

[73] Assignee: RCA Corporation, New York, N.Y.

[22] Filed: June 9, 1975

[21] Appl. No.: 585,409

Related U.S. Application Data

[63] Continuation of Ser. No. 106,357, Jan. 14, 1971, abandoned.

[52] U.S. Cl. .......................... 340/173 R; 307/238; 307/279; 357/24
[51] Int. Cl.² .................................. G11C 11/40
[58] Field of Search .............. 340/173 R; 307/238, 307/279; 357/24

[56] References Cited

UNITED STATES PATENTS

| | | | |
|---|---|---|---|
| 3,750,114 | 7/1973 | Valassis | 340/173 R |
| 3,864,550 | 2/1975 | Cragon | 340/173 R |
| 3,914,748 | 10/1975 | Barton | 340/173 R |

OTHER PUBLICATIONS

*Charge Coupled Devices* by G. F. Amelio, Scientific American, vol. 230 No. 2, Feb. 1974, pp. 22–31.

Primary Examiner—Terrell W. Fears
Attorney, Agent, or Firm—H. Christoffersen; Samuel Cohen

[57] ABSTRACT

The combination of an optical memory and a charge coupled device (CCD) memory. Light from locations of the optical memory is projected onto locations of the CCD memory for producing charge signals for storage in the CCD memory. A complete array of columns and rows of information concurrently may be projected onto the CCD memory and then later may be read out electrically from the CCD memory a row at a time.

4 Claims, 7 Drawing Figures

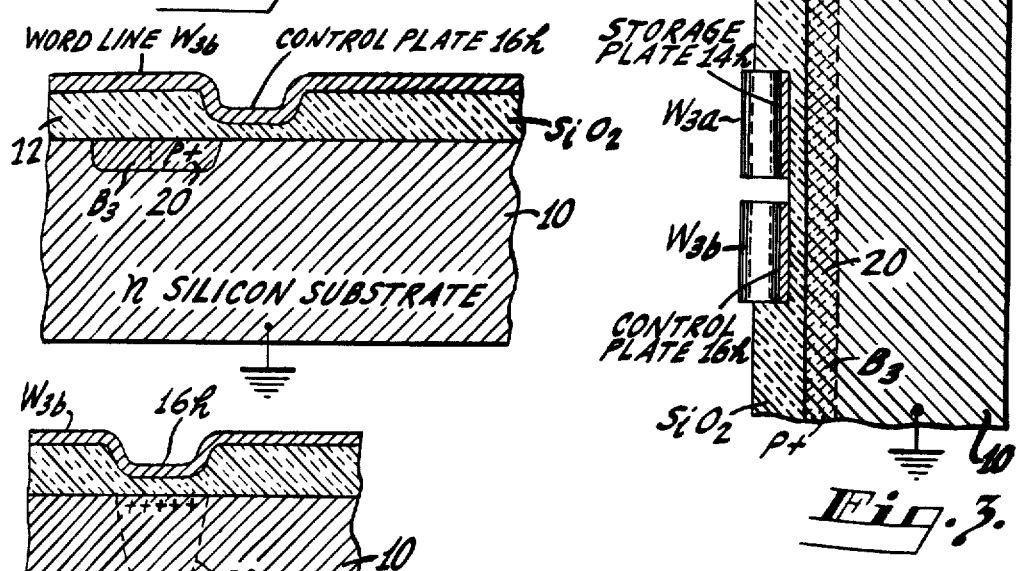
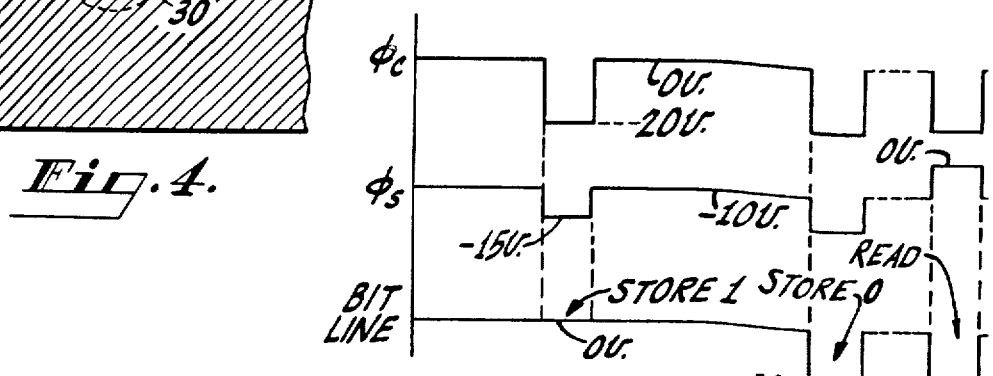
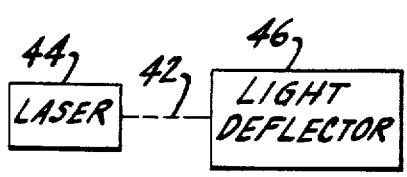
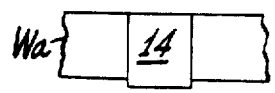
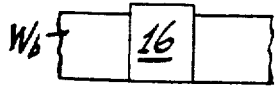

4,009,473

CHARGE COUPLED MEMORY SYSTEM

This is a continuation, of application Ser. No. 106,357, filed Jan. 14, 1971, now abandoned.

BACKGROUND OF THE INVENTION

The papers, W. S. Boyle and G. E. Smith, "Charge Coupled Semiconductor Devices," *Bell System Technical Journal*, April 1970, page 587, and G. F. Amelio, M. F. Tompsett and G. E. Smith, "Experimental Verification of the Charge Coupled Device Concept" page 593 of the same periodical, discuss charge coupled semiconductor devices. Charges are stored in potential wells created at the surface of a semiconductor and voltages are employed to move the charges along this surface. In more detail, these charges are minority carriers stored at the silicon (Si)– silicon-dioxide ($SiO_2$) interfaces of MOS capacitors. They are transferred from capacitor-to-capacitor on the same substrate by manipulating the voltages applied across the capacitors.

This invention relates to devices and circuits employing capacitors such as discussed above for storage, but including also a number of new and unobvious additional structural features, discussed in detail below, which permit the capacitors to be interconnected and operated as a memory system, such as one of the word organized type.

SUMMARY OF THE INVENTION

The combination of a charge coupled device (CCD) memory, including a plurality of memory locations, and an optical memory. Light from locations of the optical memory is applied to locations of the CCD memory for producing charge signals for storage in the CCD memory.

BRIEF DESCRIPTION OF THE DRAWING

FIGS. 2 and 3 are sections along lines 2—2 and 3—3 respectively of FIG. 1;

FIG. 4 is a section through a portion of FIG. 1 to illustrate the operation of one of the capacitors;

FIG. 5 is a drawing of waveforms present in the system of FIG. 1;

FIG. 6 is a block diagram of another embodiment of the invention; and

FIG. 7 is a plan view showing a modification of the structure of the word lines of the memory of FIG. 1.

DETAILED DESCRIPTION

Figure 1:
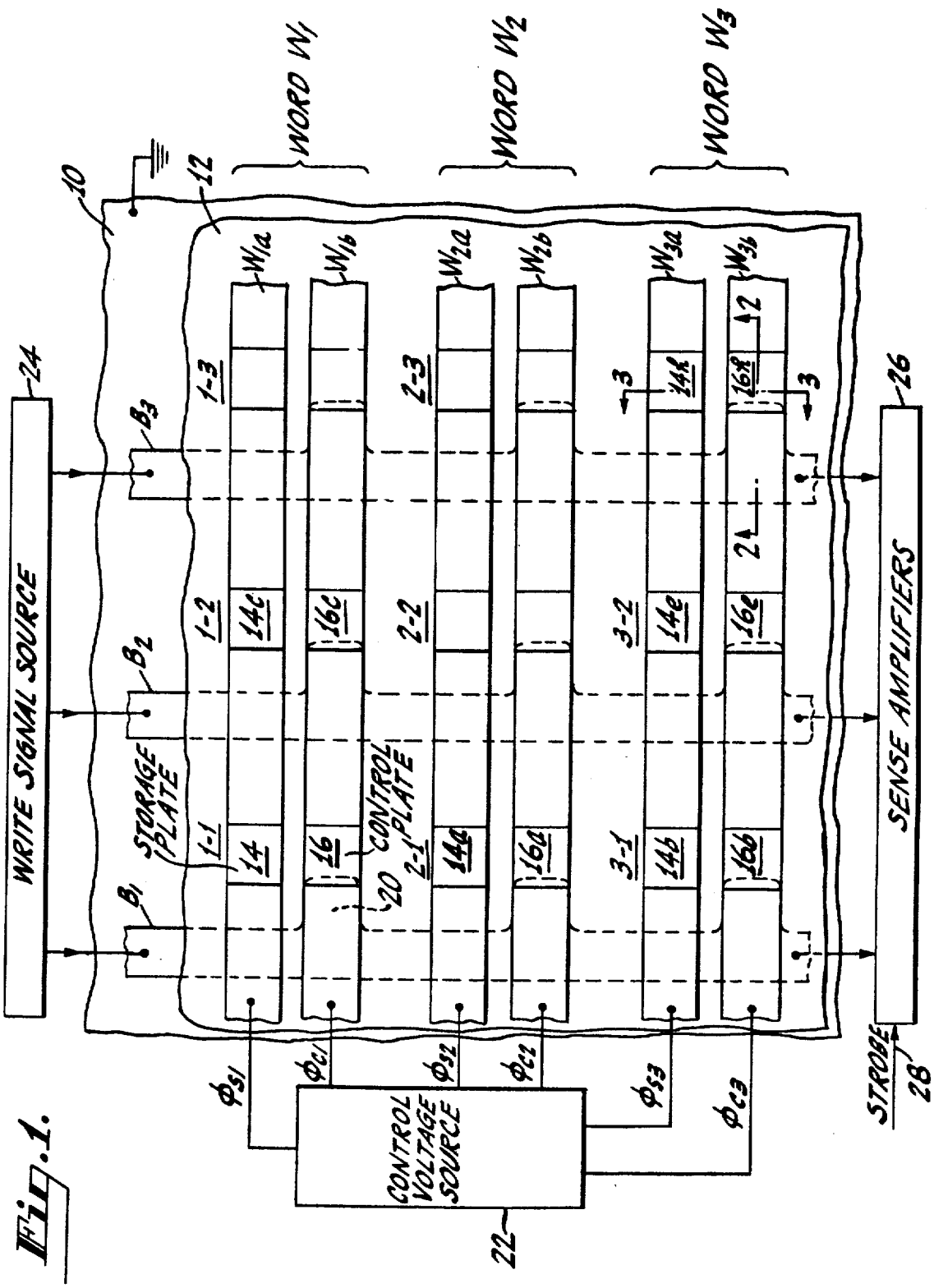
FIG. 1 is a plan view of the memory according to one embodiment of the invention.

In the discussion which follows, FIGS. 1, 2 and 3 should be referred to. The memory illustrated includes a substrate 10 formed of a semiconductor material such as n-type silicon. A plurality of conductive bit lines of p+ conductivity type, three of which are shown at $B_1$, $B_2$ and $B_3$, are formed in the substrate by, for example, diffusing a substantial amount of p-type material such as boron into the substrate. The substrate and bit lines are covered by an insulating layer 12, such as one formed of silicon dioxide ($SiO_2$).

A plurality of pairs of word conductive lines $W_{1a}$, $W_{1b}$; $W_{2a}$, $W_{2b}$; and $W_{3a}$, $W_{3b}$ formed of some metal such as aluminum or the like, are located on the substrate. For the larger portion of their extent, these lines are spaced from the substrate by a relatively thick silicon dioxide layer which may be from 10,000 to 15,000 angstroms (A) thick. At spaced points along the word lines, however, such as at 14 and 16, for example, the lines are spaced from the silicon substrate by a very thin $SiO_2$ layer about a 1000 A thick. Each pair of "plates" such as 14 and 16 together constitute a memory location such as 1—1. One of the plates 14 is termed a "storage" plate and the other plate 16 is termed a "control" plate for reasons shortly to be discussed.

Each bit line such as $B_1$, is spaced substantial distance, such as 0.2–0.5 mil or so from the storage plates such as 14, 14a and 14b along its length and a small distance— about 1000A, from the control plates 16, 16a and 16b along its length. The small spacing is achieved by forming the bit line with projections such as 20 which slightly overlap the control plates and are spaced therefrom only by the thin region of the $SiO_2$ layer. This is shown most clearly in FIG. 2. The relatively large spacing between the storage plates and bit lines is for the purpose of electrically decoupling these elements. Correspondingly, the closeness of the projections 20 to the control plates 16 insures a good electrical coupling of the bit lines to the control capacitors (the plates 16, thin SiO insulation layer and common semiconductor 10), as discussed shortly.

The system of FIG. 1 also includes a control voltage source 22 which applies negative pulses $\phi_{s1}$, $\phi_{c1}$; $\phi_{s2}$, $\phi_{c2}$ and so on to the various $W_a$ and $W_b$ word lines, as shown. A $\phi_s$ pulse may extend from a −10 volt base either to −20 volts or to 0 volts (ground level) and a $\phi_c$ may extend from a zero base line to −20 volts, as shown in FIG. 5. The lagging edge of a $\phi_c$ pulse of a pair may be time coincident with the leading edge of a $\phi_s$ pulse of that pair. Each pair of pulses is generated independently of any other pair, as discussed shortly.

A write signal source 24 is connected to the bit lines and three sense amplifiers, illustrated by the single block 26, are respectively coupled to the three bit lines.

The operation of the memory of FIG. 1 involves the transfer of charge between the bit lines and the capacitors. In response to the presence of a negative voltage pulse on a word line such as $W_{3b}$, all of the control plates 16b, 16e and 16h along that line are placed at that same potential. A potential well is created in the region of the substrate 10 adjacent to each such control plate 16, as illustrated by dotted line 30 in FIG. 4. These wells occur at the control plates because they are closely spaced to and therefore tightly electrically coupled to the substrate, whereas the remaining part of each $W_b$ word line, as it is spaced much further (at least by a factor of 10) from the substrate, is relatively decoupled from the substrate. If minority carriers— holes in the present instance, are available at the surface of the silicon in the region adjacent to the control plate such as 16h, when it is made relatively strongly negative, they will be drawn under the control plate, as indicated by the plus signs in FIG. 4.

The function of the control plate is couple the charge between the bit line (in the form of the p+ region) and the storage capacitor. The charge will be transferred from the bit line to the storage capacitor when the control plate (electrode) is made more negative by a given amount than the bit line potential. More exactly, a negative voltage applied to the control electrode will form an inversion layer — or a "channel" of holes extending from the p+ bit line to the storage capacitor. The necessary condition for forming of this conduction channel is that the control voltage $\phi_c$ (−20 volts in this example) is more negative than the sum of $V_B$ (the bit line voltage) and $V_T$, the threshold voltage. The threshold voltage $V_T$ is equivalent to the threshold voltage of an MOS device and its value depends on a number of factors including the resistivity of the substrate of which the channel is formed. As an example, $V_T$ may be 2 volts.

The result of the charge flow described above is that the potential well under the storage capacitor will fill up — or because of the introduced charges (holes), the surface potential under the storage electrode will tend to approach the potential of the bit line.

The convention arbitrarily is adopted for purposes of the present explanation that the presence of holes under a storage plate is indicative of the binary digit (bit) 1 and the absence of holes under the storage plate is indicative of the storage of the bit 0. As already implied, to write a 1 into a bit location such as 1—1, the bit line $B_1$ is placed at ground potential and concurrently a —20 volt negative pulse $\phi_{c1}$ is applied to word line $W_{1b}$ and a —15 volt pulse is applied to word line $W_{1a}$. (The remaining $b$ word lines $W_{2b}$, and $W_{3b}$ are maintained at ground potential and the $a$ word lines $W_{1a}$, $W_{2a}$ and $W_{3a}$ are maintained at negative voltage such as —10 volts. The latter is done to retain the information previously stored in the word lines $W_{2a}$ and $W_{3a}$.) As the bit line $B_1$ is of +p conductivity type and is relatively positive with respect to the —20 volts applied to the control plate 16, the bit line acts as a source of minority carrier— holes, and these holes pass to the region of the substrate beneath the storage plate 14, the latter being at a potential of —15 volts.

In order to write a 0 in a memory location such as 1—1, the same procedure as discussed above is followed, except that the bit line $B_1$ is placed at a potential (such as —20 volts) which is below the potential of the storage well during the negative pulse $\phi_{c1}$. The result is that no charge can be transferred to the storage well. In fact, any charge existing in the storage well will tend to flow towards the bit line. Accordingly, when the negative pulse $\phi_{c1}$ terminates, there is an absence of holes, representing the bit 0, stored under the storage plate.

As already mentioned, during the time the word $W_1$ is being written, the $W_{2b}$ and $W_{3b}$ lines are maintained at ground. Accordingly, even if a bit line such as $B_1$ is acting as a source of minority carriers — holes, these holes are not transferred to the control plates such as 16a and 16b. On the other hand, the word lines $W_{2a}$ and $W_{3a}$ are quiescently at —10 volts so that whatever information was previously stored at storage plate 14a and 14b remains stored there. With a material such as n-type silicon, the storage time which can be expected is about 10 seconds which is quite adequate in many memory applications.

The reading of the output of the memory is similar to the write "0" except now the potential on the storage electrode $\phi_s$, is made less negative (is raised in potential to ground in this example). This forces the charge (if any) stored under the storage electrode to flow to the digit line — or to an intermediate well created by the potential applied to the control electrode if $V_B$ (the bit line potential) is more negative than $\phi_c$ (the control electrode potential). However, if $\phi_c$ is more negative than $V_B$ then this means that the control electrode will induce a conductionchannel from the digit line to the storage cell. In this case the induced conduction channel will, in effect, extend the bit line to the region adjacent to the storage capacitor and remove any stored charge under the storage capacitor.

To read the information stored at a location such as 1—1, the bit line $B_1$ is placed at a negative voltage such as —20 volts, the storage plate is raised in potential to say 0 volts and a —20 or more negative pulse $\phi_{c1}$ is applied to the word line $W_{1b}$. The control plate 16 is thus made substantially more negative than the storage plate 14 and if the area under the former is storing holes (representing the bit 1) these holes transfer from the area under the storage plate, under the control of the control plate to the bit line $B_1$. The passage of such minority carriers to the bit line $B_1$ results in the flow of current through this line which can be sensed either in the form of a current or as a change in voltage, by the sense amplifier within block 26 connected to the $B_1$ line. As is usual practice, a strobe pulse may be applied to the sense amplifier via line 28 for turning the sense amplifier on only during the read interval (during the negative pulse $\phi_{c1}$).

A 0 may be read out of memory location in exactly the same way as described above. However, if the capacitor formed of the storage plate is storing a 0 (the absence of holes), no charge is transferred from 14 via 16 to the bit line $B_1$ in response to the negative pulse $\phi_{c1}$. Accordingly, the sense amplifier connected to that line will produce an output signal of substantially zero amplitude, representing readout of the bit 0. After the readout of a word of information, that same information may be "regenerated" (written into the same locations along the word line) in the same manner as already described for the write operation.

In the embodiment of the invention shown in FIG. 1 as described above, information is written into the memory electrically and read from the memory electrically. It is to be understood, however, that information may be written in other ways, for example, by radiation, such as light, or by heat. In the former case, the information initially may be stored in an optical storage medium such as the holographic memory 40 of FIG. 6. Each hologram may occupy a relatively small space on a storage medium such as photographic film, a photochromic material, or a magnetic material such as manganese-bismuth. While in practice each hologram may store a thousand or more bits, for purpose of the present application it may be considered that each hologram contains nine bits of information and that the reconstructed image of the hologram consists of nine areas which superimpose over the nine control plates 16 of the memory of FIG. 1.

In response to the selection of a storage location (the deflection of the beam 42 of the laser 40 to that location by the light deflector 46), the reconstructed image of the selected hologram superimposes over the memory 48 of the present invention. A 1 appears as an intense light source at a control plate and a 0 appears like a dark area at a control plate. In this embodiment of the invention, the control plates are formed of transparent conductors or, alternatively, the light is shined through the silicon substrate. In either case, the light, when present, causes minority carriers — holes to be generated and these can be stored and later read out in the same manner as already discussed. Moreover, all nine bits can be stored concurrently and can be read out a word at a time.

The memory of FIG. 1 may be constructed by techniques well known in the art. The manufacture starts with the n-type substrate 10. The pattern of bit lines may then be laid down on the substrate using an appropriate mask and photoresist. Thereafter, the regions in the photoresist corresponding to the bit lines may be removed (for example, by etching) and the bit lines formed by diffusing sufficient boron through the substrate to make the lines conductive and of p+ type. Thereafter, the remainder of the photoresist may be removed from the substrate surface and a thick silicon dioxide layer 12 thermally grown on the surface.

Next, using techniques similar to those described above, the patterns of storage and control plates may be formed on the surface of the $SiO_2$ insulator 12. The silicon dioxide at the storage and control plate locations may then be fully etched away. Thereafter an additional layer of $SiO_2$ may be laid down to a depth of about 1000A.

After the step above, a metal layer such as aluminum may be formed over the entire surface of silicon dioxide, for example, by vacuum evaporation. Then using techniques similar to those already discussed, the portions of the metal layer other than those occupied by the word lines and control and storage plates may be etched away.

As mentioned above, the storage time of the memory cells of the present invention is a matter of 10 seconds or so. After a period such as this, there is sufficient thermal generation of minority carriers to affect the stored information. However, the storage time of the memory can be increased by employing a "memory refresh" system. Here, the information stored in the memory is periodically read out and then reinserted in the same locations by means, for example, of a plurality of shift registers.

While for purposes of illustration, the memory discussed above is shown to have an n-type silicon substrate and p+ conductive bit lines, a number of other constructions are possible. For example, the silicon substrate may be p-type and the conductive bit lines n-type. Here, with appropriate operating voltages, the bit line, if operated as the source of minority carriers, provides electrons rather than holes.

It is also possible to fabricate the memory by employing a sapphire substrate with a relatively thin silicon layer on one surface of the sapphire performing the same function as the silicon substrate of the illustrated memory. As in the present memory, if the semiconductor is n-type silicon, each bit line may be a region of this silicon layer heavily doped with impurities to provide a conductor of p+ type. The other elements of the memory may be similar to these shown in FIGS. 1–3.

By way of example, following are a number of dimensions of a typical memory such as shown in FIG. 1:
  Width of word and bit lines = 0.3 mils
  Spacing between the two lines of a pair = from less than 0.1 to 0.3 mils
  spacing between the $W_b$ line and next adjacent $W_a$ line = 0.3 mils If desired, the control plates may be spaced closer to the storage plates than the remainder of the W$b$ and W$a$ lines as shown in FIG. 7. In this case, the lower limit of spacing (0.1 mil or less) is preferable between each control and storage plate and the remainder of the line may be spaced 0.3 mil from its paired line.

Some important advantages of the memory of the present invention are that each storage location requires only two very small area MOS capacitors so that the memory is simple, compact and economical. Another feature of the memory is that no metal to silicon contacts are required in the storage cell.

What is claimed is:
1. The combination of:
  a charge-coupled device memory including a plurality of memory locations, each such location including means for storing charge signals,
  an optical memory having a plurality of storage locations for producing, when read out, a light pattern output indicative of the information stored in said locations;
  means for producing a charge pattern in said charge coupled device memory corresponding to the information stored in said optical memory comprising means for reading out said optical memory and for applying the light pattern thereby obtained indicative of the information stored in said locations of said optical memory onto locations of the charge-coupled device memory for producing charge signals for storage in the charge coupled device memory.

2. In the combination as set forth in claim 1, said charge-coupled device memory including a semiconductor substrate, conductors over the substrate electrically coupled thereto at spaced regions along their length, each region of a conductor electrically coupled to the substrate being at a storage location and being responsive to an applied voltage for forming a potential well in the substrate for the storage of charge signals.

3. In the combination as set forth in claim 2, said memory locations of said charge-coupled device memory being arranged in columns and rows and the light pattern projected from the optical memory onto said charge-coupled memory also including columns and rows of bright regions which superimpose over the columns and rows of memory locations of said charge-coupled device memory.

4. In the combination as set forth in claim 1, said charge-coupled device memory having M columns and N rows, M and N being integers greater than 1, and wherein said means for applying said light pattern from said optical memory to said charge-coupled device memory comprises means for applying, in parallel, a light pattern indicative of the information in M columns and N rows which is stored in the optical memory onto said M columns and N rows of memory locations of said charge-coupled device memory, and said combination further including means for reading-out said charge-coupled device memory one row at a time.

* * * * *